(12) United States Patent
Barrenscheen et al.

(10) Patent No.: US 9,391,604 B2
(45) Date of Patent: Jul. 12, 2016

(54) METHODS FOR MONITORING FUNCTIONALITY OF A SWITCH AND DRIVER UNITS FOR SWITCHES

(75) Inventors: Jens Barrenscheen, Munich (DE); Laurent Beaurenaut, Neubiberg (DE)

(73) Assignee: Infineon Technologies Austria AG, Villach (AT)

( * ) Notice: Subject to any disclaimer, the term of this patent is extended or adjusted under 35 U.S.C. 154(b) by 364 days.

(21) Appl. No.: 13/356,343

(22) Filed: Jan. 23, 2012

(65) Prior Publication Data

US 2013/0187656 A1 Jul. 25, 2013

(51) Int. Cl.
*G01R 31/327* (2006.01)
*H03K 17/28* (2006.01)

(52) U.S. Cl.
CPC ............ *H03K 17/28* (2013.01); *G01R 31/3275* (2013.01)

(58) Field of Classification Search
CPC ............ H03K 17/0822; H03K 17/166; H03K 3/02337; G01R 31/327
USPC ........... 327/108, 424, 430; 324/415, 500, 555
See application file for complete search history.

(56) References Cited

U.S. PATENT DOCUMENTS

| | | | |
|---|---|---|---|
| 6,906,574 B2 | 6/2005 | Ohi et al. | |
| 7,615,940 B2 * | 11/2009 | Qiu et al. | 315/308 |
| 7,990,184 B2 * | 8/2011 | Son | 327/87 |
| 8,008,953 B1 * | 8/2011 | Brumett et al. | 327/109 |
| 8,072,202 B2 * | 12/2011 | Yang et al. | 323/282 |
| 2003/0197993 A1 | 10/2003 | Mirowski et al. | |
| 2007/0257725 A1 | 11/2007 | De et al. | |
| 2010/0007320 A1 * | 1/2010 | Qiu et al. | 323/285 |
| 2010/0013452 A1 * | 1/2010 | Tang et al. | 323/282 |
| 2010/0090728 A1 * | 4/2010 | Logiudice et al. | 327/108 |
| 2011/0109361 A1 * | 5/2011 | Nishio | 327/170 |
| 2011/0199071 A1 * | 8/2011 | Barrenscheen | 323/351 |
| 2011/0204925 A1 * | 8/2011 | Barrenscheen et al. | 327/74 |

FOREIGN PATENT DOCUMENTS

| | | |
|---|---|---|
| CN | 101114796 A | 1/2008 |
| CN | 101682720 A | 3/2010 |
| CN | 101697454 A | 4/2010 |
| DE | 10334832 A1 | 3/2004 |

* cited by examiner

*Primary Examiner* — Arleen M Vazquez
*Assistant Examiner* — Brent J Andrews
(74) *Attorney, Agent, or Firm* — Slater Matsil, LLP (57) ABSTRACT

A gate driver unit includes an input stage, an output stage, a read/write interface, and a monitoring stage. The input stage is configured to receive control signals and forward the control signals to the output stage and the monitoring stage. The read/write interface is configured to receive configuration data and forward the configuration data to the monitoring stage. The monitoring stage is configured to capture and evaluate signals of a power switch connected to the gate driver unit and synchronize the evaluation of the signals of the power switch to the control signals. The evaluation of the signals and the synchronization of the evaluation are based on the configuration data.

30 Claims, 7 Drawing Sheets

METHODS FOR MONITORING FUNCTIONALITY OF A SWITCH AND DRIVER UNITS FOR SWITCHES

TECHNICAL FIELD

The invention relates to driver units for switches and methods for monitoring functionality of a switch for use in a driver unit connected to the switch, in particular in safety-critical power systems with power switches.

BACKGROUND

Safety engineering is a growing field in which engineers use redundancy techniques in order to mitigate adverse consequences if an error occurs. For example, space vehicles and aircrafts include redundant systems so that if an engine control component fails during flight, for example, another engine control component can be activated to allow the aircraft to land safely.

In a similar regard, timed input/output (I/O) signals in safety conscious systems can be generated and then subsequently checked to ensure they were actually delivered correctly. This can be useful in any number of applications. For example, in an automotive system, if an output drive signal (e.g., sparkplug signal from an engine controller) is provided to an automobile's engine, a feedback signal (which is derived from the output drive signal that was actually delivered to the engine) can be compared with the original output drive signal to determine whether the output drive signal was, in fact, delivered correctly. Thus, if there is a "bad" connection between the engine controller and the engine itself (or if some other error event occurs), a comparison of the original drive signal and the feedback signal can detect this error, thereby allowing a control system to notify the driver, for example, by illuminating a "check engine" light on the driver's dashboard. In this way, a driver can be informed that an engine problem (e.g., a sparkplug misfire) has occurred, and can then get the vehicle serviced to remedy any corresponding problems.

In safety-critical power systems with power switches (e.g., metal-oxide-semiconductor field-effect transistors (MOSFETs) or insulated gate bipolar transistors (IGBTs)) there is the need to analyze functional blocks in the power system before starting the operation of the system to avoid damages in case of malfunction of some functional blocks. Furthermore, diagnosis capability is needed during runtime to detect aging effects or analyze sudden failures.

A standard output of a normal control device is not capable of driving directly the control input (gate) of a power switch. Therefore, a gate driver component with its own power supply is needed to amplify the control signals and to adapt them to the needs of power switches. To avoid losses and to ensure correct switching behavior, the gate driver components are normally located near the power switch.

In some cases, the gate driver component introduces a galvanic isolation barrier between the control device and the power switch since they do not refer to the same potential. Here, the gate driver comprises a "low-voltage" primary side which is connected to the "low-power" control device and a "high-voltage" secondary side connected to the power switch, wherein the primary side and the secondary side are separated by a galvanic isolation barrier. As a consequence, the diagnosis capability of the complete system is reduced, since it is rather expensive to handle analog values under these conditions.

Especially when doing a Failure Mode and Effects Analysis (FMEA), run-time tests, in particular sanity check mechanisms, are very helpful for implementing a safety concept containing the specification that a device has to react in a defined way even if pin connections fail, for example.

In addition, some applications require a so-called "limp home" functionality. Even if a component fails, other parts of the system have to continue working to achieve a minimum functionality over a certain time (a 3-phase motor can run with two phases, but with lower performance, for example). Depending on the root cause of the failure, different limp home strategies have to be applied. Therefore, detailed knowledge about the cause of an error, i.e., diagnostic capability, is needed.

Therefore, there, e.g., exists a need for an apparatus and method offering a sanity check mechanism for driver units for switches, in particular power switches, which is flexible and cost effective.

SUMMARY OF THE INVENTION

In accordance with one aspect of the invention, there is provided a gate driver unit comprising an input stage, an output stage, a read/write interface, and a monitoring stage. The input stage is configured to receive control signals and forward the control signals to the output stage and the monitoring stage. The read/write interface is configured to receive configuration data and forward the configuration data to the monitoring stage. The monitoring stage is configured to capture and evaluate signals of a power switch connected to the gate driver unit and synchronize the evaluation of the signals of the power switch to the control signals. The evaluation of the signals and the synchronization of the evaluation are based on the configuration data.

In accordance with a further aspect of the invention, there is provided a method for monitoring functionality of a power switch connected to a gate driver unit. The method comprises receiving control signals, receiving configuration data, and capturing and evaluating signals of the power switch connected to the gate driver unit and synchronizing the evaluation of the signals of the power switch to the control signals. The evaluation of the signals and the synchronization of the evaluation are based on the configuration data.

Further features, aspects and advantages of the present invention will become apparent from the following detailed description of the invention made with reference to the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles of the invention. Other embodiments of the present invention and many of the intended advantages of the present invention will be readily appreciated as they become better understood by reference to the following detailed description.

DETAILED DESCRIPTION OF ILLUSTRATIVE EMBODIMENTS

In the following detailed description, reference is made to the accompanying drawings, which form a part hereof, and in which is shown by way of illustration specific embodiments in which the invention may be practiced. It is to be understood that other embodiments may be utilized and structural or other changes may be made without departing from the scope of the present invention. The following detailed description, therefore, is not to be taken in a limiting sense, and the scope of the present invention is defined by the appended claims.

The following description of preferred embodiments often refers to a comparison of a certain value, e.g., a voltage, with two thresholds, to determine whether the certain value lies within a predefined range or acceptance window. The comparison of the certain value with the two thresholds may be carried out for the two thresholds in parallel (i.e., essentially simultaneously) or may be carried out subsequently (i.e., at a first time, the certain value is compared with the first threshold and, at a second time, the certain value is compared with the second threshold). It is to be appreciated that the wording "a comparison of a value with two thresholds" is not to be limited to one of the two alternatives described above, but covers both alternatives, i.e., in particular, two consecutive comparisons with respectively one threshold are also considered as "a comparison of a value with two thresholds".

Such a comparison of a certain value with two thresholds may be carried out, for example, to detect stuck-at-faults (e.g., due to a short-circuit) between switch and supply voltage. If it is determined that the certain value exceeds a single threshold or not, a short circuit to a voltage may not be detected under certain circumstances.

According to an aspect of the invention, a method for monitoring functionality of a switch for use in a driver unit is connected to the switch. The driver unit comprises an input stage for receiving a control signal and an output stage for amplifying the control signal. Outputting the amplified control signal to the switch, comprises comparing a characteristic value of the amplified control signal output by the output stage with two threshold values to determine whether the value lies within an interval specified by the two threshold values. Upon receiving a control signal for causing a change of state of the switch, the control signal is forwarded to a delay element configured to output the control signal after a predefined delay. When the delay element outputs the control signal, a current result of the comparison of the characteristic value of the amplified control signal is compared with two threshold values to determine whether the characteristic value of the amplified control signal lies within an interval specified by the two threshold values after a certain time period defined by the delay of the delay element has elapsed.

Advantageously, the step of comparing the characteristic value of the amplified control signal output by the output stage with the two threshold values to determine whether the value lies within the interval specified by the two threshold values is performed continuously or periodically.

Advantageously, the characteristic value of the amplified control signal is a voltage which is applied to a control input of the switch. Advantageously, the switch is a power switch and the input stage comprises a galvanic isolation barrier.

Advantageously, the method further comprises outputting an error signal if the characteristic value of the amplified control signal does not lie within the interval specified by the two threshold values after the certain time period defined by the delay of the delay element has elapsed. The switch is switched-off in response to the error signal.

According to a further aspect of the invention, a method for monitoring functionality of a switch for use in a driver unit is connected to the switch. The driver unit comprises an input stage for receiving a control signal and an output stage for amplifying the control signal and outputting the amplified control signal to the switch. A timer is started upon receiving a control signal that causes a change of state of the switch. A characteristic value of the amplified control signal output by the output stage is compared with a reference value. The characteristic value of the amplified control signal reaches the reference value, comparing a current timer value with two timer threshold values to determine whether the characteristic value of the amplified control signal reaches the reference value within a time interval specified by the two timer threshold values.

Advantageously, the step of comparing a characteristic value of the amplified control signal output by the output stage with a reference value is performed continuously or periodically. Advantageously, the characteristic value of the amplified control signal is a voltage which is applied to a control input of the switch. Advantageously, the switch is a power switch and the input stage comprises a galvanic isolation barrier.

Advantageously, the method further comprises outputting an error signal if the characteristic value of the amplified control signal does not reach the reference value within the time interval specified by the two timer threshold values. The switch is switched-off in response to the error signal.

According to a further aspect of the invention, a driver unit for a switch comprises an input stage that receives a control signal and forwards the control signal to an output stage and a delay element. The output stage amplifies the control signal and outputs the amplified control signal to the switch and a comparator. The comparator is configured to receive the amplified control signal from the output stage, determine whether a characteristic value of the amplified control signal lies within an interval specified by two threshold values and forwards the result of the determination to an evaluator. The delay element is configured to receive the control signal from the input stage and output the received control signal after a predetermined delay to an evaluator. The evaluator is configured to evaluate the result of the determination of the comparator when receiving the delayed control signal from the delay element to determine whether the characteristic value of the amplified control signal lies within the interval specified by the two threshold values after a certain time period defined by the delay of the delay element has elapsed.

Advantageously, the comparator is further configured to continuously or periodically determine whether the characteristic value of the amplified control signal lies within the interval specified by the two threshold values and forward the result of the determination to the evaluator.

Advantageously, the switch is a power switch and the input stage comprises a galvanic isolation barrier. Advantageously, the control signal is a pulse width modulation signal.

Advantageously, the characteristic value of the amplified control signal is a voltage which is applied to a control input of the switch. Advantageously, the characteristic value of the amplified control signal is a current of the amplified control signal.

Advantageously, the evaluator is further configured to transmit an error signal to the output stage if the characteristic value of the amplified control signal does not lie within the interval specified by the two threshold values after the certain time period defined by the delay of the delay element has elapsed. The output stage is further configured to control the switch to switch-off when receiving the error signal from the evaluator.

According to a further aspect of the invention, a driver unit for a switch comprises an input stage that receives a control signal and forwards the control signal to an output stage and a timer. The output stage amplifies the control signal and outputs the amplified control signal to the switch and a comparator. The timer is configured to be started upon receiving the control signal from the input stage and to output timer values to an evaluator. The comparator is configured to compare a characteristic value of the amplified control signal output by the output stage with a reference value and send a trigger signal to the evaluator when the characteristic value of the amplified control signal reaches the reference value. The evaluator is configured to compare a current timer value with two timer threshold values when receiving the trigger signal to determine whether the characteristic value of the amplified control signal reaches the reference value within a time interval specified by the two timer threshold values.

Advantageously, the comparator is further configured to continuously or periodically compare a characteristic value of the amplified control signal output by the output stage with a reference value.

Advantageously, the switch is a power switch and the input stage comprises a galvanic isolation barrier. Advantageously, the control signal is a pulse width modulation signal.

Advantageously, the characteristic value of the amplified control signal is a voltage which is applied to a control input of the switch. Advantageously, the characteristic value of the amplified control signal is a current of the amplified control signal.

Advantageously, the evaluator is further configured to transmit an error signal to the output stage if the characteristic value of the amplified control signal does not reach the reference value within the time interval specified by the two timer threshold values. The output stage is further configured to control the switch to switch-off when receiving the error signal from the evaluator.

According to a further aspect of the invention, a method for monitoring functionality of a switch for use in a driver unit connected to the switch, comprises upon receiving a control signal for changing a state of the switch, initiating measurement of a value characteristic for the switch and forwarding the control signal to a delay element configured to output the control signal after a predefined delay. When the delay element outputs the control signal, a currently measured value is compared with two threshold values to determine whether the measured value lies within an interval specified by the two threshold values after a certain time period defined by the delay of the delay element has elapsed.

Figure 1:
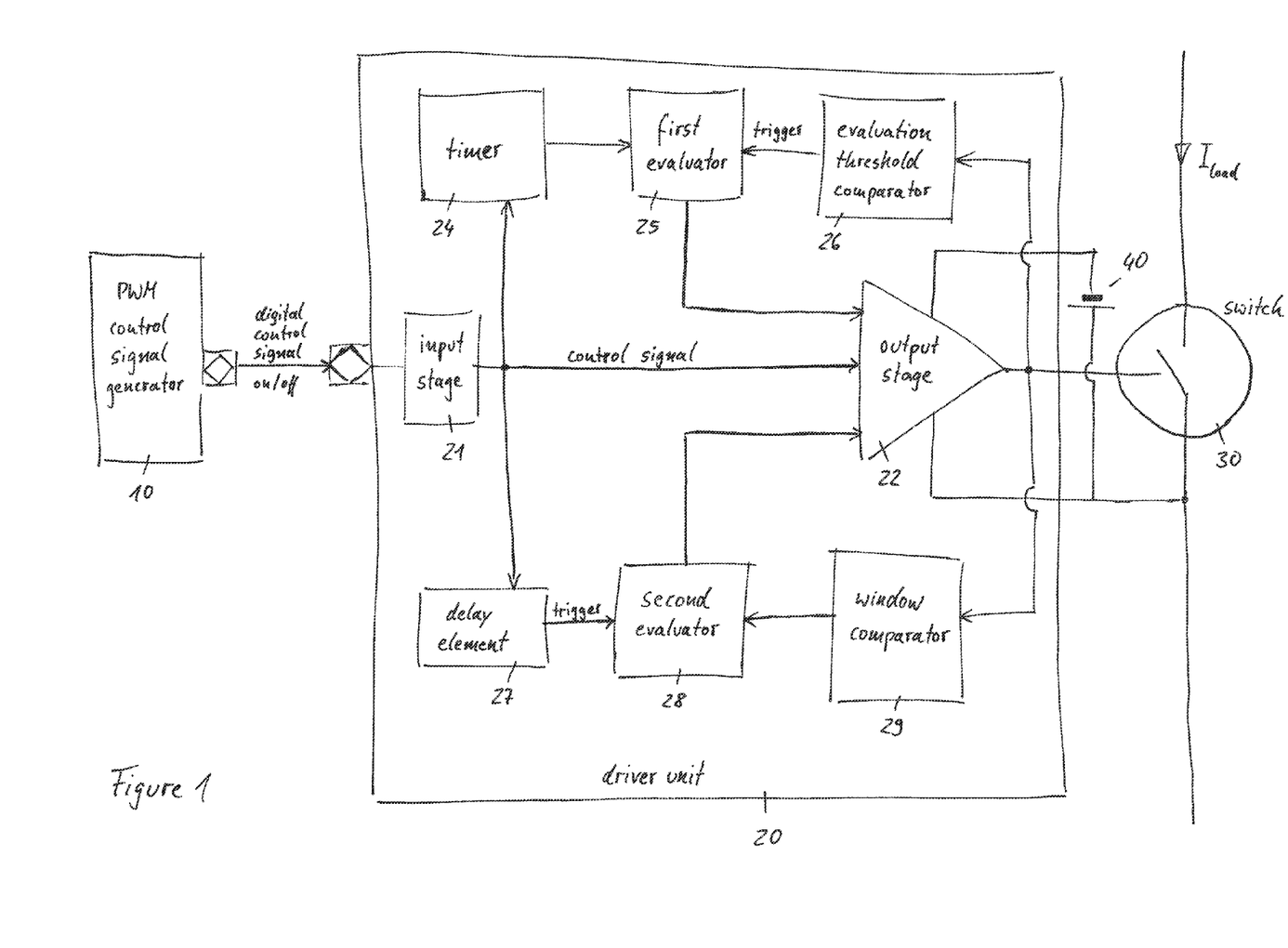
FIG. 1 exemplarily shows a simplified schematic diagram of a system comprising a driver unit according to an embodiment of the invention.

FIG. 1 exemplarily shows a simplified schematic diagram of a system comprising a driver unit according to an embodiment of the invention. The system comprises a pulse width modulation (PWM) control signal generator 10, preferably a microcontroller, a driver unit 20, a switch 30, and a power supply 40 wherein the driver unit 20 is connected to the PWM control signal generator 10 and the switch 30. In an embodiment, PWM control signal generator 10 produces a digital control signal that assumes an "on" state and an "off" state.

The driver unit 20 comprises an input stage 21, an output stage 22, a timer or counter 24, a first evaluator 25, an evaluation threshold comparator 26, a delay element 27, a second evaluator 28, and a window comparator 29.

The input stage 21 has its input connected to the PWM control signal generator 10, and its output connected to an input of the timer 24, a first input of the output stage 22, and an input of the delay element 27. The output stage 22 has its output connected to the switch 30, an input of the evaluation threshold comparator 26, and an input of the window comparator 29. The first evaluator 25 has its first input connected to an output of the timer 24, its second input connected to an output of the evaluation threshold comparator 26, and its output connected to a second input of the output stage 22. The second evaluator 28 has its first input connected to an output of the delay element 27, its second input connected to an output of the window comparator 29, and its output connected to a third input of the output stage 22.

In the following, operation of the system shown in FIG. 1 is described. The input stage 21 receives the PWM control signal from the PWM control signal generator 10 and forwards the PWM control signal to the output stage 22, the timer 24, and the delay element 27. The input stage 21 may comprise a galvanic isolation barrier if the PWM signal generator 10 and the output stage 22 refer to different potentials.

The output stage 22 which is connected to the power supply 40 amplifies the PWM control signal received from the input stage 21 and outputs the amplified signal to a control input of the switch 30, e.g., gate or base of a transistor (MOSFET or IGBT, for example), for controlling the switching of the switch 30. The output stage 22 further outputs the amplified signal to the evaluation threshold comparator 26 and the window comparator 29.

The evaluation threshold comparator 26 compares the amplified voltage signal to an evaluation threshold, a certain voltage level, for example, to determine whether the voltage applied to the control input, e.g., gate, of the switch has reached the evaluation voltage threshold. When the evaluation threshold comparator 26 determines that the voltage applied to the control input of the switch is equal (or greater than) the evaluation voltage threshold, it sends a trigger signal to the first evaluator 25.

The timer 24 receives the PWM control signal from the input stage 21. When the timer 24 receives a certain PWM control signal, e.g., an "on" or "high" signal, in particular a change from an "off" signal to an "on" signal, the timer 24 (or counter) starts to measure the time elapsed since the PWM control signal changed from "off" to "on", for example.

The first evaluator 25 continuously receives the timer values from the timer 24. When the first evaluator 25 receives the trigger signal from the evaluation threshold comparator 26, it evaluates or determines whether the currently received timer value lies within a predetermined time window or not. Dependent on the result of the determination, the first evaluator 25 may carry out certain operations. For example, if the current timer value does not lie within the predetermined time window, the first evaluator 25 may transmit an error signal to the output stage 22, which may cause the driver unit 20 to control the switch 30 to switch to a defined state, e.g., to switch off. In certain specific applications, however, the defined state may also be the "on" state.

The window comparator 29 receives the amplified signal from the output stage 22 and compares the voltage level of the received amplified signal with two predetermined voltage thresholds defining a predetermined voltage range or voltage window to determine whether the voltage level of the amplified signal lies within the predetermined voltage range or voltage window or not. The window comparator 29 then transmits a corresponding signal to the second evaluator 28 which indicates that the current voltage level of the amplified signal lies or does not lie within the predetermined voltage range or voltage window. Additionally, the window comparator 29 may also transmit a value indicating the actual voltage level of the amplified signal currently received from the output stage 22.

Thus, the second evaluator 28 continuously receives signals from the window comparator 29 which at least indicate that the current voltage level of the amplified signal lies or does not lie within the predetermined voltage range or voltage window.

The delay element 27 receives the PWM control signal from the input stage 21. When the delay element 27 receives a certain PWM control signal, e.g., an "on" or "high" signal, the delay element forwards the PWM control signal after a predetermined delay to the second evaluator 28. Thus, the delay element 27 delays the PWM control signal such that the second evaluator 28 receives the PWM control signal at a desired well-defined point in time. The delay of the delay element 27 may be configurable to adjust the delay to the requirements of different applications, in particular, different transistors such as MOSFET, IGBT, etc.

The delayed PWM control signal may be considered as a trigger signal for the second evaluator 28. When the second evaluator 28 receives the delayed PWM control signal, it evaluates the signal currently received from the window comparator 29 and may carry out a certain operation. For example, if the signal received from the window comparator 29 indicates that the current voltage level of the amplified signal does not lie within the predetermined voltage range or window, the second evaluator 28 may transmit an error signal to the output stage 22, which may cause the driver unit 20 to control the switch 30 to switch to a defined state, e.g., to switch off.

Figure 2:
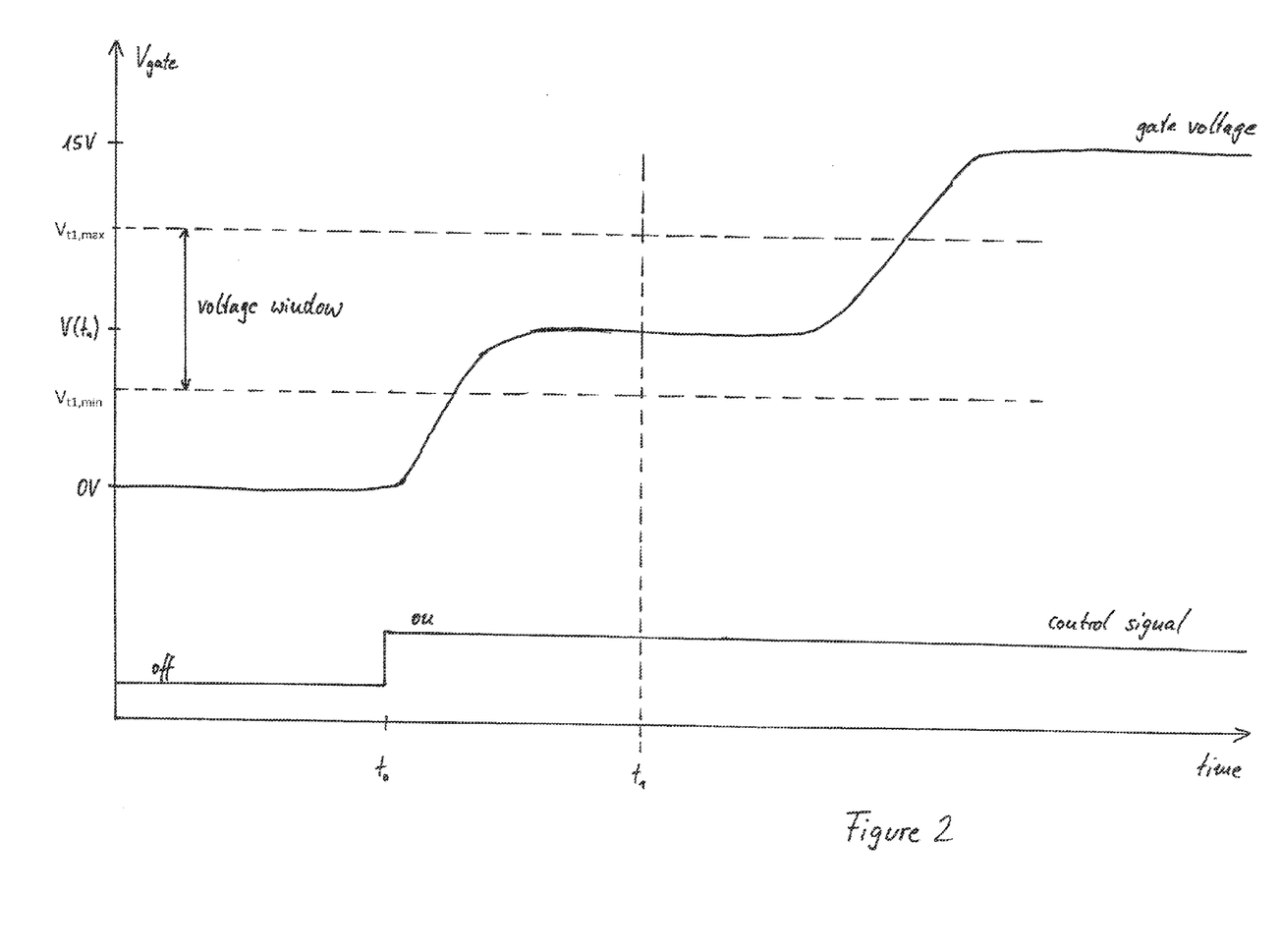
FIG. 2 illustrates an exemplary application for the system shown in FIG. 1.

FIG. 2 illustrates an exemplary application for the system shown in FIG. 1. In this exemplary application, it is checked whether the voltage $V_{gate}$ which is applied to a control input (gate, base, etc.) of a transistor (MOSFET, IGBT, etc.), when switching on the transistor, lies within a configurable voltage range or acceptance window at a certain time after the control signal has changed from "off" to "on". To simplify matters, this voltage $V_{gate}$ is simply referred to as "gate voltage" in the following. In particular, it is checked whether a height of a gate voltage plateau, which is formed when a conductive channel is building up in the transistor, lies within a configurable voltage range or acceptance window.

At a time $t_1$ (which is configurable by adjusting the delay element 27 of the system according to FIG. 1, for example) at which the gate voltage should have reached a certain plateau level, the gate voltage level of the transistor is compared (by the window comparator 29 and the second evaluator 28 of the system according to FIG. 1, for example) with two predetermined voltage thresholds, $V_{t1,max}$ and $V_{t1,min}$, defining a predetermined voltage range or voltage window to determine whether the voltage level of the amplified signal lies within this configurable acceptance window or not.

If the current gate voltage level does not lie within the acceptance window, the gate driver unit does not operate correctly. On the one hand, if the gate voltage level is below the minimum threshold $V_{t1,min}$, the driver unit takes too much load which may originate from a short circuit fault of the driver unit, for example. On the other hand, if the gate voltage level is above the maximum threshold $V_{t1,max}$ the driver unit takes too little load, which may originate from a defective or broken connection between the driver unit and the switch.

Figure 3:
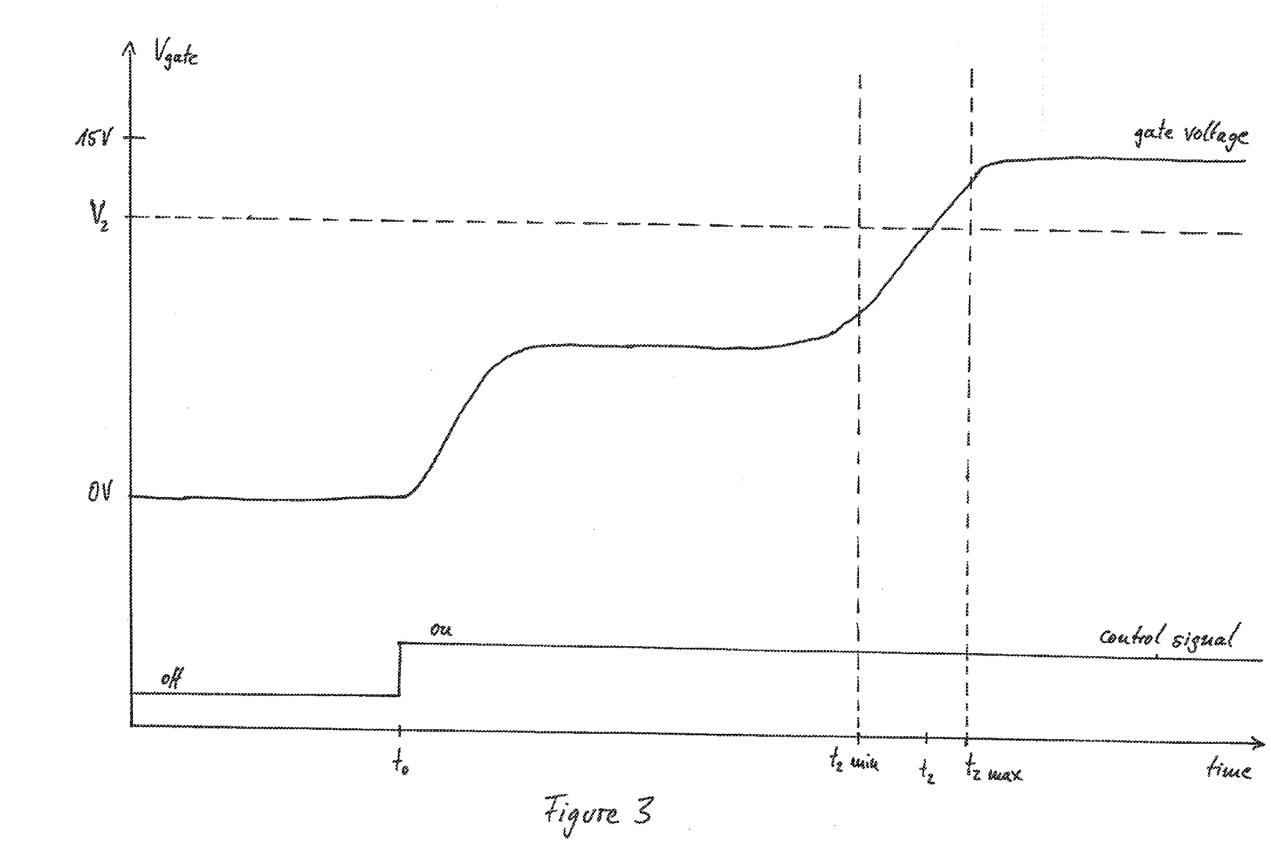
FIG. 3 illustrates a further exemplary application for the system shown in FIG. 1.

FIG. 3 illustrates a further exemplary application for the system shown in FIG. 1. In this exemplary application, it is checked whether the voltage $V_{gate}$ which is applied to a control input (gate, base, etc.) of a transistor (MOSFET, IGBT, etc.), when switching on the transistor, reaches a predefined voltage level $V_2$, also referred to as "evaluation threshold", within a certain configurable time window after the control signal has changed from "off" to "on". To simplify matters, this voltage $V_{gate}$ is simply referred to as "gate voltage" in the following.

When the control signal has changed from "off" to "on", a timer or counter is started and the gate voltage is continuously monitored. In particular, the current gate voltage level is compared to an evaluation threshold (by the evaluation threshold comparator 26 of the system according to FIG. 1, for example) to determine whether the gate voltage has reached the evaluation voltage threshold $V_2$. When the evaluation threshold comparator 26 determines that the voltage applied to the control input of the switch is equal (or greater than) the evaluation voltage threshold, the timer is stopped to capture the time $t_2$ elapsed since the control signal has changed from "off" to "on". The captured timer value $t_2$ is then compared with two predetermined time limits, $t_{2,max}$ and $t_{2,min}$, defining a predetermined time (acceptance) window to determine whether the captured timer value $t_2$ lies within the time window or not. For example, the evaluation threshold comparator 26 may output a trigger signal to the first evaluator 25 which captures the current value of the timer 24 and compares it with the time acceptance window.

If the timer value does not lie within the acceptance window, the gate driver unit does not operate correctly. On the one hand, if the timer value $t_2$ is smaller than the minimum threshold $t_{2,min}$, i.e. the gate voltage reaches the defined voltage level prior to the start of the acceptance time window, the driver unit takes too little load which may originate from a defective or broken connection between the driver unit and the switch, for example. On the other hand, if the timer value is greater than the maximum threshold $t_{2,max}$ i.e., the gate voltage reaches the defined voltage level past the end of the acceptance time window, the driver unit takes too much load, which may originate from a short circuit fault of the driver unit, for example.

Figure 4:
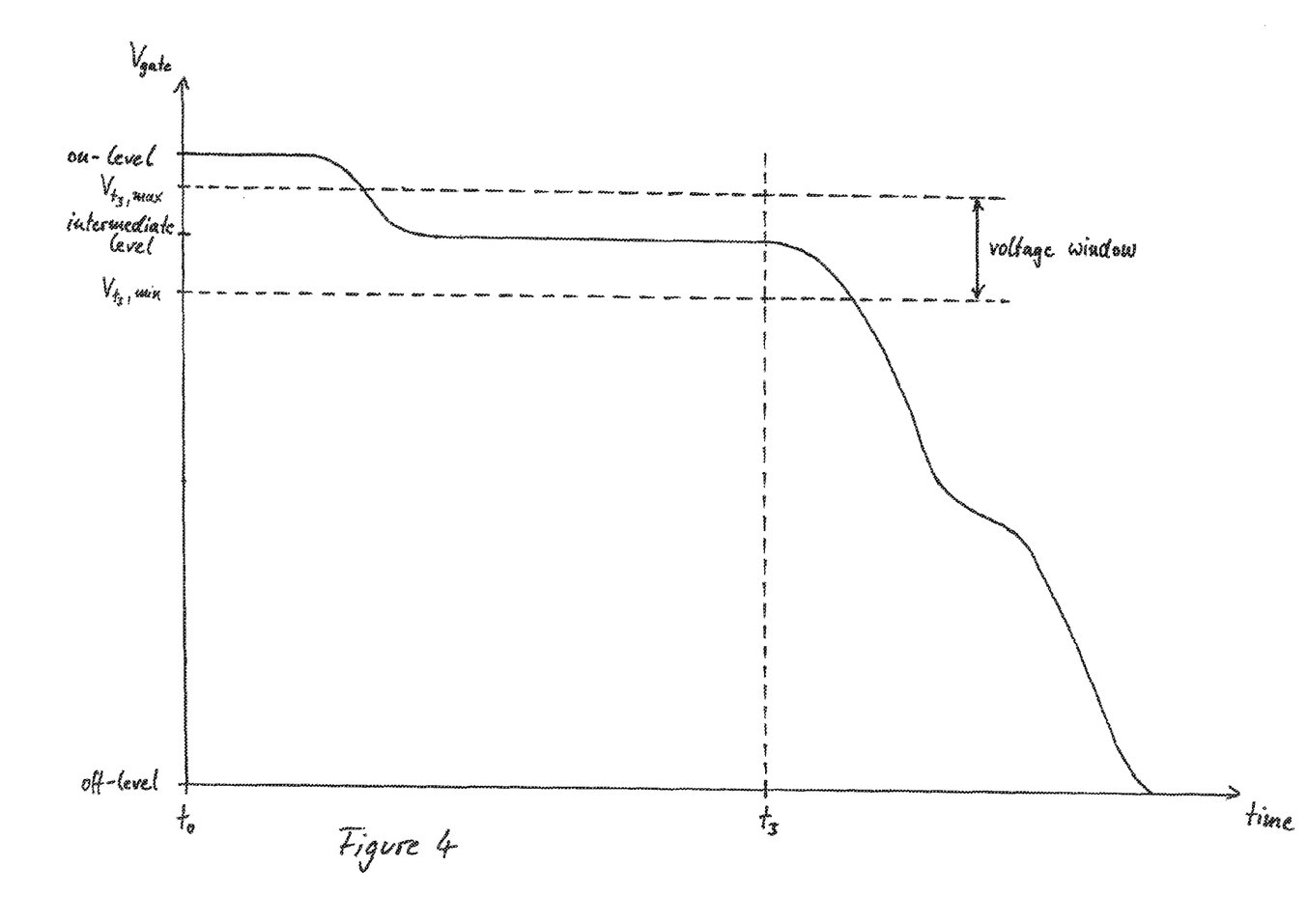
FIG. 4 illustrates a further exemplary application for the system shown in FIG. 1.

FIG. 4 illustrates a further exemplary application for the system shown in FIG. 1. This exemplary application refers to a switch off process in a two-level mode (2L) for a power switch. In a two-level switch off, the gate voltage is reduced in a first step before the switch is actually switched off in a second step. When switching off in 2L mode, it may preferably be checked if the gate voltage reaches an intermediate level, the 2L plateau, at a certain time to ensure that the switch off path via the 2L is connected correctly. If this level is not reached (e.g., the switch off path is not connected), an alternative (e.g., redundant path) may be activated to perform a soft switch off of the power switch. This approach may avoid a short circuit in the power switch and reduce stress within the switch.

In the exemplary application of FIG. 4, it is checked whether the voltage $V_{gate}$ which is applied to a control input (gate, base, etc.) of a transistor (MOSFET, IGBT, etc.), lies within a configurable voltage range or acceptance window at a certain time after a switch off command has been received. To simplify matters, this voltage $V_{gate}$ is simply referred to as "gate voltage" in the following. In particular, it is checked whether a height of the 2L gate voltage plateau is reached at a certain time, i.e., whether the gate voltage lies within a configurable voltage range or acceptance window at the certain time.

At a time $t_3$ (which is configurable by adjusting the delay element 27 of the system according to FIG. 1, for example) at which the gate voltage should have reached a certain plateau level, the gate voltage level of the transistor is compared (by the window comparator 29 and the second evaluator 28 of the system according to FIG. 1, for example) with two predetermined voltage thresholds, $V_{t3,max}$ and $V_{t3,min}$, defining a predetermined voltage range or voltage window to determine whether the voltage level of the amplified signal lies within this configurable acceptance window or not.

If the current gate voltage level does not lie within the acceptance window, the gate driver unit does not operate correctly and the power switch may be turned off by an alternative process, such as a soft switch off.

Figure 5:
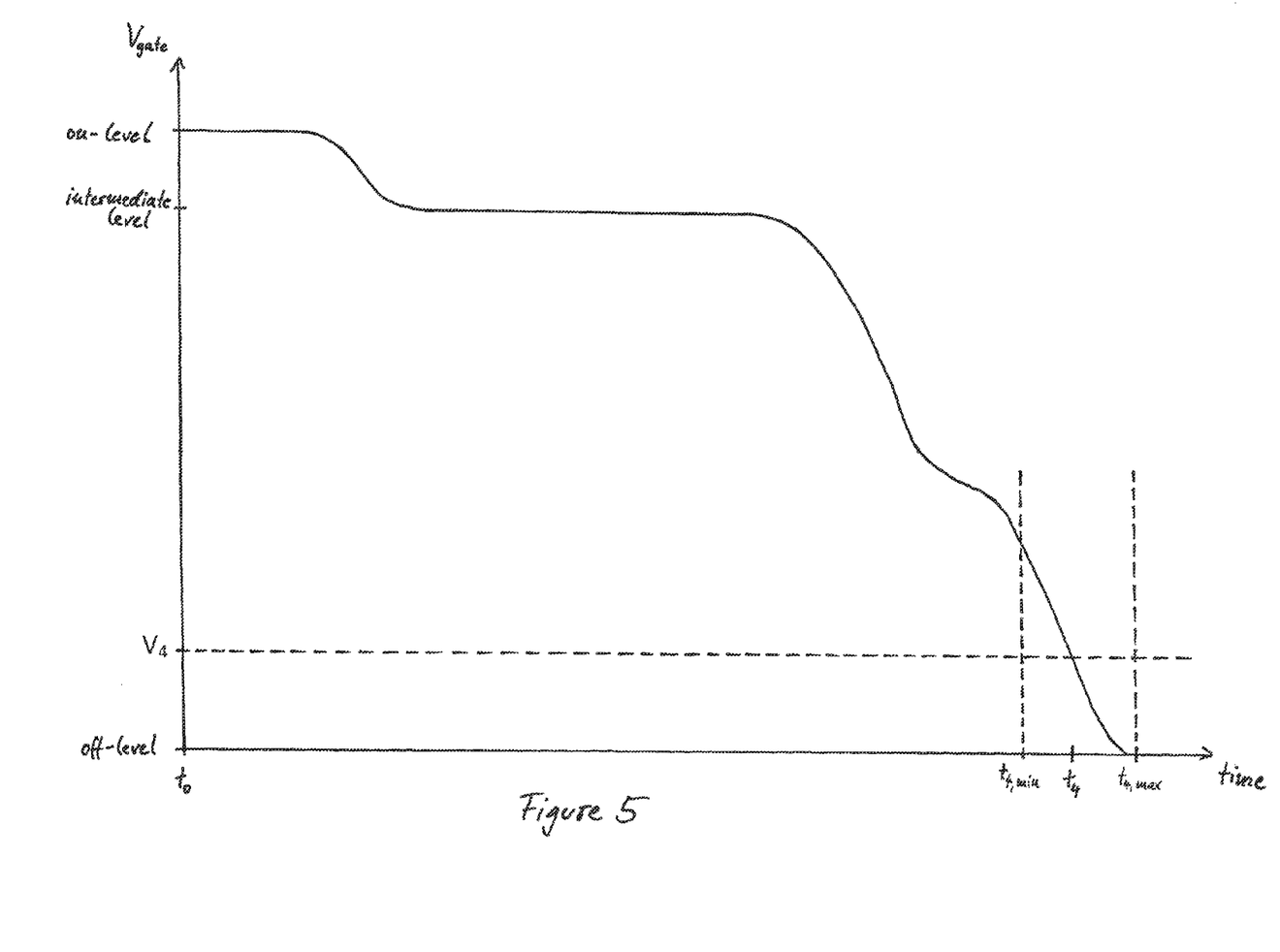
FIG. 5 illustrates a further exemplary application for the system shown in FIG. 1.

FIG. 5 illustrates a further exemplary application for the system shown in FIG. 1. This exemplary application also refers to a two-level switch off process for a power switch. In this exemplary application, it is checked whether the voltage $V_{gate}$ which is applied to a control input (gate, base, etc.) of a transistor (MOSFET, IGBT, etc.) reaches a predefined voltage level $V_4$, herein also referred to as "off-verification threshold", within a certain configurable time window after a switch off command has been received. To simplify matters, this voltage $V_{gate}$ is simply referred to as "gate voltage" in the following.

When the control signal has changed from "on" to "off" at the time $t_0$, a timer or counter is started and the gate voltage is continuously monitored. In particular, the current gate voltage level is compared to an off-verification threshold (by the evaluation threshold comparator 26 of the system according to FIG. 1, for example) to determine whether the gate voltage has reached the voltage threshold $V_4$. When the evaluation threshold comparator 26 determines that the voltage applied to the control input of the switch is equal (or greater than) the off-verification threshold, the timer is stopped to capture the time $t_4-t_0$ elapsed since the control signal has changed from "off" to "on". The captured timer value $t_4$ is then compared with two predetermined time limits, $t_{4,max}$ and $t_{4,min}$, defining a predetermined time (acceptance) window to determine whether the captured timer value $t_4$ lies within the time window or not. For example, the evaluation threshold comparator 26 may output a trigger signal to the first evaluator 25 which captures the current value of the timer 24 and compares it with the time acceptance window.

In many cases, it may only be desired to check whether the gate voltage has fallen below the off-verification threshold at the time $t_{4,max}$ at the latest, i.e., whether $t_4$ (the time at which the gate voltage has fallen below the off-verification threshold) is smaller or equal to $t_{4,max}$. This is, however, only a special case of the time window described above. In this case, the lower limit, $t_{4,min}$, of the time window is not required and may be set equal to 0.

Figure 6:
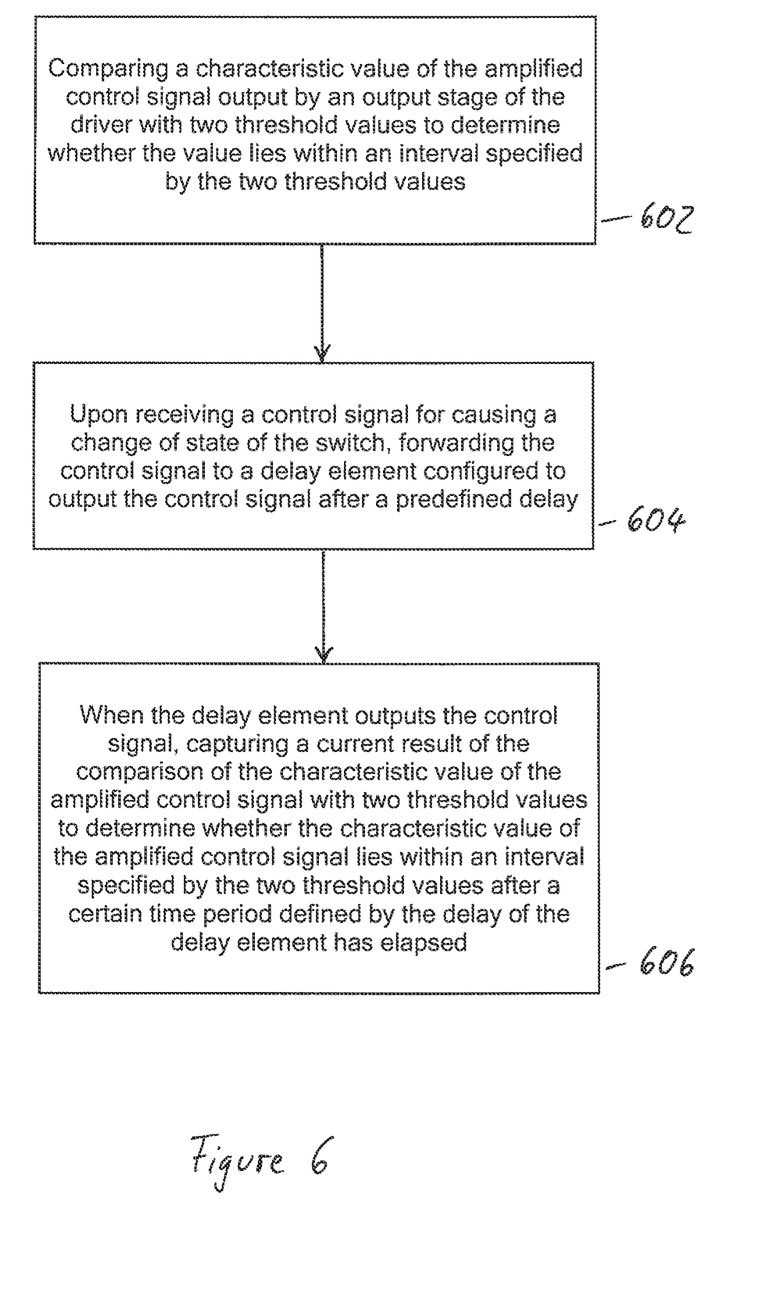
FIG. 6 shows a method for monitoring functionality of a switch according to a further embodiment of the invention.

FIG. 6 shows a method for monitoring functionality of a switch according to a further embodiment of the invention. The method is designed for use in a driver unit which is connected to the switch to be monitored and comprises the following steps. A characteristic value of the amplified control signal output by an output stage of the driver unit is compared with two threshold values to determine whether the value lies within an interval specified by the two threshold values (step 602). A control signal for causing a change of state of the switch is received and forwards the control signal to a delay element configured to output the control signal after a predefined delay (step 604). The delay element outputs the control signal and captures a current result of the comparison of the characteristic value of the amplified control signal with two threshold values to determine whether the characteristic value of the amplified control signal lies within an interval specified by the two threshold values after a certain time period defined by the delay of the delay element has elapsed (step 606).

Figure 7:
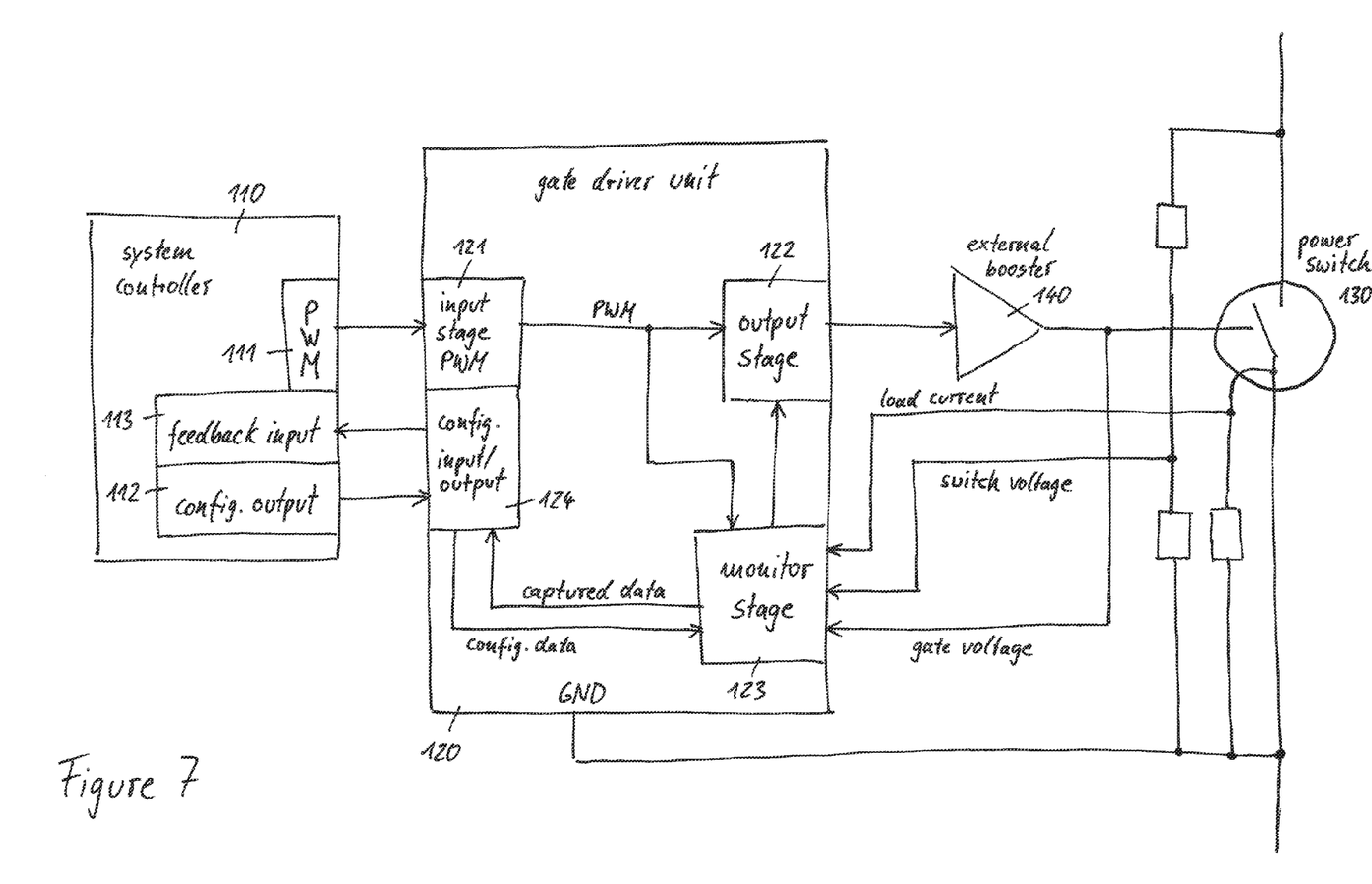
FIG. 7 exemplarily shows a simplified schematic diagram of a system comprising a driver unit according to a further embodiment of the invention.

FIG. 7 exemplarily shows a simplified schematic diagram of a system comprising a driver unit according to a further embodiment of the invention. The system comprises a system controller 110, a gate driver unit 120, a switch 130, and, optionally, an external booster 140. The driver unit 120 is connected to the system controller 110 and the switch 130. The external booster 140 is optional and may be inserted between the gate driver unit 120 and the power switch 130 to amplify the control signals output by the gate driver unit 120 for the power switch 130.

The system controller 110 comprises a pulse width modulation (PWM) control signal generator 111, a configuration data output 112 and a feedback input 113.

The gate driver unit 120 comprises an input stage 121, an output stage 122 connected to the input stage 121, a monitoring stage 123 connected to the input stage 121 and the output stage 122, and a read/write interface 124 connected to the monitoring stage 123.

The read/write interface 124 may be a serial interface, e.g., a serial parallel interface (SPI) or an inter-integrated-circuit ($I^2C$) interface.

The input stage 121 receives PWM control signals from the PWM control signal generator 111 and forwards the PWM control signals to the output stage 122 and the monitoring stage 123. The input stage 121 may comprise a galvanic isolation barrier if the PWM control signal generator 111 and the output stage refer to different potentials.

The output stage 122 amplifies the PWM control signal received from the input stage 121 and outputs the amplified signal to the external booster 140 which additionally amplifies the signal received from the output stage 122 and outputs the further amplified signal to the power switch 130. In case the system does not comprise an external booster 140, the output stage 122 outputs the amplified signal directly to the power switch 130.

The monitoring stage 123 is suitably connected to the power switch 130 to capture a load current, a switch voltage and/or a gate voltage of the power switch 130. The monitoring unit 123 also receives the PWM control signals from the input stage 121 to allow synchronization of an evaluation of the power switch signals to the PWM control signal.

The monitoring stage 123 further receives configuration data from the configuration data output 112 of the system controller 110 via the read/write interface 124 to allow configuration of parameters (e.g., delays, thresholds, value ranges, etc.) for the evaluation of the signals of the power switch (i.e., load current, switch voltage and/or gate voltage) and/or the synchronization of the evaluation. Thus, the system is configured to allow a first (static) configuration of the above parameters to meet the demands of a certain application, for example.

In addition, the system may also allow for further (dynamic) adjustment of the above parameters, in particular dynamic adjustment of thresholds and value ranges during operation of the power switch 130. For this, the monitoring stage 123 may receive further configuration data from the configuration data output 112 of the system controller 110, e.g., periodically or at irregular intervals.

The monitoring stage 123 may output the captured signals of the power switch 130 (i.e. load current, switch voltage and/or gate voltage) and/or the result(s) of the evaluation of the captured signals of the power switch 130 to the feedback input 113 of the system controller 110 via the read/write interface 124. On the one hand, this feedback of data of the switch allows to monitor and/or process the captured signals of the power switch (i.e., load current, switch voltage and/or gate voltage) and/or the result(s) of the evaluation of the captured signals of the power switch. On the other hand, this feedback of data of the switch allows to update the configuration data (for the evaluation carried out by the monitoring stage 123) based on the feedback data of the switch (i.e., the captured signals of the power switch and/or the result(s) of the evaluation of the captured signals of the power switch).

In case the evaluation carried out by the monitoring stage 123 indicates a malfunction of the power switch 130, the monitoring stage 123 may transmit an error signal to the output stage 122 to cause the gate driver unit 120 to control the power switch 130 to switch to a defined state, e.g., to switch off ("local hardware switch-off"). Additionally, the system controller 110 may also be configured to determine a malfunction of the power switch 130 and, upon detection of a malfunction, send an error signal to the gate driver unit 120 to cause the gate driver unit 120 to control the power switch 130 to switch to a defined state, e.g., to switch off ("remote software switch-off").

Examples for different options for the evaluation of the captured signals of the power switch and the synchronization thereof to the PWM control signals have already been described in detail with reference to FIGS. 2 to 5.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A gate driver unit comprising:
an input stage;
an output stage;
a read/write interface; and
a monitoring stage;
wherein the input stage is configured to receive digital control signals from an external system controller and forward the digital control signals to the output stage and the monitoring stage;
wherein the read/write interface is configured to receive configuration data and forward the configuration data to the monitoring stage;
wherein the monitoring stage is configured to capture and evaluate signals of a power switch connected to the gate driver unit and synchronize the evaluation of the signals of the power switch to the digital control signals; and
wherein the evaluation of the signals and the synchronization of the evaluation are based on the configuration data, and the configuration data comprise a value specifying a time delay from a transition time of at least one digital control signal to a time at which the monitoring stage captures and evaluates the signals of the power switch.

2. The gate driver unit according to claim 1,
wherein the read/write interface is further configured to receive updated configuration data and forward the updated configuration data to the monitoring stage;
wherein the monitoring stage is further configured to capture and evaluate further signals of the power switch and synchronize the evaluation of the further signals of the power switch to the digital control signals; and
wherein the evaluation of the further signals and the synchronization of the evaluation are based on the updated configuration data.

3. The gate driver unit according to claim 1,
wherein the read/write interface is further configured to periodically receive updated configuration data and forward the respective updated configuration data to the monitoring stage; and
wherein the monitoring stage is further configured to capture and evaluate further signals of the power switch and synchronize the evaluation of the further signals of the power switch to the digital control signals; and
wherein the evaluation of the further signals and the synchronization of the evaluation are based on the respective updated configuration data.

4. The gate driver unit according to claim 1, wherein the configuration data comprise a range of values and the evaluation of the signals of the power switch comprises determining whether a signal last captured from the power switch lies within the range of values.

5. The gate driver unit according to claim 1, wherein the monitoring stage is further configured to initiate a time measurement when receiving a predefined control signal and capture a time value in response to a predefined event.

6. The gate driver unit according to claim 5, wherein the configuration data further comprise a time interval and the monitoring stage is further configured to determine whether a captured time value lies within the time interval.

7. The gate driver unit of claim 1, wherein the read/write interface is further configured to transmit feedback data from the monitoring stage to the external system controller.

8. The gate driver unit according to claim 7, wherein the feedback data comprises a result of the evaluation of captured signals of the power switch, and wherein the monitoring stage is further configured to forward the result of the evaluation to the read/write interface for transmitting the result of the evaluation to the external system controller.

9. The gate driver unit according to claim 1, wherein, if the evaluation of captured signals of the power switch indicates a malfunction of the power switch, the monitoring stage is further configured to output an error signal to the output stage to cause the gate driver unit to control the power switch to switch to a defined state.

10. The gate driver unit according to claim 8, wherein, if the monitoring stage receives an error signal from the external system controller indicating a malfunction of the power switch, the monitoring stage is further configured to forward the received error signal to the output stage to cause the gate driver unit to control the power switch to switch to a defined state.

11. The gate driver unit according to claim 1, wherein captured signals of the power switch comprise at least one of the following:
a load current;
a switch voltage; and
a gate voltage.

12. The gate driver unit according to claim 1, wherein the digital control signals are pulse width modulation (PWM) signals.

13. The gate driver unit according to claim 1, wherein the read/write interface is a serial interface.

14. A gate driver unit comprising:
an input stage;
an output stage;
a read/write interface; and
a monitoring stage;
wherein the input stage is configured to receive digital control signals from an external system controller and forward the digital control signals to the output stage and the monitoring stage;
wherein the read/write interface is configured to receive configuration data and forward the configuration data to the monitoring stage;
wherein the monitoring stage is configured to capture and evaluate signals of a power switch connected to the gate driver unit and synchronize the evaluation of the signals of the power switch to the digital control signals;
wherein the evaluation of the signals and the synchronization of the evaluation are based on the configuration data;
wherein the monitoring stage comprises
  a delay element configured to receive a digital control signal from the input stage and forward the digital control signal to an evaluator after a predetermined delay, wherein the predetermined delay composes a portion of the configuration data received from the read/write interface, and
  a comparator configured to
    receive an amplified digital control signal from the output stage, wherein the amplified digital control signal is based on the digital control signal, and
    determine whether a characteristic value of the amplified digital control signal lies within an interval specified by two threshold values and forward a determination result to the evaluator.

15. A gate driver unit comprising:
an input stage;
an output stage;
a read/write interface; and
a monitoring stage;
wherein the input stage is configured to receive digital control signals from an external system controller and forward the digital control signals to the output stage and the monitoring stage;
wherein the read/write interface is configured to receive configuration data and forward the configuration data to the monitoring stage;
wherein the monitoring stage is configured to capture and evaluate signals of a power switch connected to the gate driver unit and synchronize the evaluation of the signals of the power switch to the digital control signals;
wherein the evaluation of the signals and the synchronization of the evaluation are based on the configuration data;
wherein the monitoring stage comprises
  a timer configured to start upon receipt of a digital control signal from the input stage and to periodically forward timer values to an evaluator, and
  a comparator configured to
    receive an amplified digital control signal from the output stage, wherein the amplified digital control signal is based on the digital control signal, and
    compare a characteristic value of the amplified digital control signal with a reference value and send a trigger signal to the evaluator when the characteristic value reaches the reference value, wherein the reference value composes a portion of the configuration data received from the read/write interface.

16. A method of operating a gate driver unit, comprising:
receiving, at an input stage, and forwarding digital control signals to an output stage and a monitoring stage;
receiving, at a read/write interface, and forwarding configuration data to the monitoring stage;
capturing, at the monitoring stage, signals of a power switch connected to the gate driver unit;
evaluating, at the monitoring stage, the signals according to the configuration data; and
synchronizing the evaluating with the digital control signals according to the configuration data, and the configuration data comprise a value specifying a time delay from a transition time of at least one digital control signal to a time at which the monitoring stage captures and evaluates the signals of the power switch.

17. The method according to claim 16, further comprising:
receiving updated configuration data; and
capturing and evaluating further signals of the power switch and synchronizing the evaluating of the further signals of the power switch to the digital control signals, wherein the evaluating of the further signals and the synchronizing of the evaluating are based on the updated configuration data.

18. The method according to claim 16, further comprising:
periodically receiving updated configuration data; and
capturing and evaluating further signals of the power switch and synchronizing the evaluating of the further signals of the power switch to the digital control signals, wherein the evaluating of the further signals and the synchronizing of the evaluating are based on the last received updated configuration data.

19. The method according to claim 16, wherein the configuration data comprise a range of values and the evaluating of the signals of the power switch comprises determining whether a signal last captured from the power switch lies within the range of values.

20. The method according to claim 16, further comprising:
initiating a time measurement when receiving a predefined digital control signal; and
capturing a time value in response to a predefined event.

21. The method according to claim 20, wherein the configuration data further comprise a time interval and wherein the evaluating the signals of the power switch comprises determining whether the captured time value lies within the time interval.

22. The method according to claim 16, wherein captured signals of the power switch comprise at least one of the following:
a load current;
a switch voltage; and/or
a gate voltage.

23. The method according to claim 16, further comprising transmitting captured signals of the power switch from the capturing.

24. The method according to claim 16, further comprising transmitting a result of the evaluating the signals of the power switch.

25. The gate driver unit of claim 14, wherein:
the monitoring stage further comprises the evaluator;
the two threshold values compose another portion of the configuration data received from the read/write interface; and
the evaluator is configured to evaluate the determination result upon receipt of the digital control signal from the delay element to determine whether the characteristic value of the amplified digital control signal lies within the interval.

26. The gate driver unit of claim 15, wherein:
the monitoring stage further comprises the evaluator;
the evaluator is configured to compare a current timer value from the timer with two timer threshold values upon receipt of the trigger signal from the comparator to determine whether the characteristic value of the amplified digital control signal reaches the reference value within a time interval specified by the two timer threshold values; and
the two timer threshold values compose another portion of the configuration data received from the read/write interface.

27. The gate driver unit according to claim 7, wherein the feedback data comprises captured signals of the power switch, and wherein the monitoring stage is further configured to forward the captured signals to the read/write interface for transmitting the captured signals to the external system controller.

28. The gate driver unit of claim 5, wherein the configuration data further comprises a value defining a time interval that starts a first time period after receiving the predefined digital control period and ends a second time period after the start of the first time period, and wherein the evaluating the signals of the power switch comprises determining whether the captured time value lies within the time interval.

29. The method of claim 16, further comprising transmitting, at the read/write interface, feedback data from the monitoring stage to an external system controller.

30. The method of claim 20, wherein the configuration data further comprises a value defining a time interval that starts a first time period after receiving the predefined digital control period and ends a second time period after the start of the first time period, and wherein the evaluating the signals of the power switch comprises determining whether the captured time value lies within the time interval.

* * * * *